(12) United States Patent
Roesler et al.

(10) Patent No.: US 11,942,915 B2
(45) Date of Patent: Mar. 26, 2024

(54) BULK ACOUSTIC WAVE RESONATOR DEVICE AND METHOD OF MANUFACTURING THEREOF

(71) Applicant: RF360 EUROPE GMBH, Munich (DE)

(72) Inventors: Ulrike Roesler, Munich (DE); Willi Aigner, Moosinning (DE); Maximilian Schiek, Puchheim (DE); Giuseppe Toscano, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 555 days.

(21) Appl. No.: 17/042,698

(22) PCT Filed: Mar. 7, 2019

(86) PCT No.: PCT/EP2019/055761
§ 371 (c)(1),
(2) Date: Sep. 28, 2020

(87) PCT Pub. No.: WO2019/185324
PCT Pub. Date: Oct. 3, 2019

(65) Prior Publication Data
US 2021/0058050 A1      Feb. 25, 2021

(30) Foreign Application Priority Data

Mar. 28, 2018   (DE) ..................... 10 2018 107 496.4

(51) Int. Cl.
*H03H 3/02*   (2006.01)
*H03H 9/02*   (2006.01)
(Continued)

(52) U.S. Cl.
CPC .......... *H03H 3/02* (2013.01); *H03H 9/02015* (2013.01); *H03H 9/174* (2013.01);
(Continued)

(58) Field of Classification Search
CPC ..... H03H 3/02015; H03H 9/174; H03H 9/175
See application file for complete search history.

(56) References Cited

U.S. PATENT DOCUMENTS

2011/0277928 A1   11/2011   Araki et al.
2012/0049976 A1*   3/2012   Son ...................... H03H 9/131
                                          29/25.35

(Continued)

FOREIGN PATENT DOCUMENTS

EP           1 489 740 A2    12/2004

OTHER PUBLICATIONS

International Search Report and Written Opinion dated Jun. 4, 2019 corresponding to Application No. PCT/EP2019/055761.
(Continued)

*Primary Examiner* — Bryan P Gordon
(74) *Attorney, Agent, or Firm* — Patterson + Sheridan LLP

(57) ABSTRACT

A bulk acoustic wave resonator device comprises bottom and top electrodes (120, 360). A piezoelectric layer (355) sandwiched therebetween has a thickness in the active resonator area different from the thickness in the surrounding area. A method of manufacturing the device comprises a bonding of a piezoelectric wafer to a carrier wafer and splitting a portion of the piezoelectric wafer by an ion-cut technique. Different thicknesses of the piezoelectric layer in the active area and the surrounding area are achieved by implanting ions at different depths.

7 Claims, 5 Drawing Sheets

(51) Int. Cl.
*H03H 9/17* (2006.01)
*H10N 30/072* (2023.01)

(52) U.S. Cl.
CPC .......... *H03H 9/175* (2013.01); *H10N 30/072* (2023.02); *H03H 2003/023* (2013.01); *H03H 2003/025* (2013.01)

(56) References Cited

U.S. PATENT DOCUMENTS

| | | |
|---|---|---|
| 2012/0206216 A1 | 8/2012 | Deguet |
| 2012/0218057 A1 | 8/2012 | Burak et al. |
| 2015/0115772 A1* | 4/2015 | Ishii ................ H03H 9/1021 310/318 |
| 2016/0028369 A1* | 1/2016 | Yamamoto ........... H03H 9/1021 310/365 |
| 2017/0033766 A1* | 2/2017 | Jacobsen ................ H03H 9/175 |
| 2018/0083597 A1* | 3/2018 | Han .................. H03H 9/02118 |
| 2018/0351533 A1* | 12/2018 | Lee .................. H03H 9/02086 |
| 2019/0305753 A1* | 10/2019 | Shealy ................ H03H 9/0514 |

OTHER PUBLICATIONS

Gachon, D. et al, "High Frequency Bulk Acoustic Wave Resonator Using Thinned Monocrystalline Lithium Niobate," Frequency and Time Forum (EFTF) 2006 20th European IEEE, Mar. 27, 2006, pp. 14-17.

* cited by examiner

BULK ACOUSTIC WAVE RESONATOR DEVICE AND METHOD OF MANUFACTURING THEREOF

CROSS-REFERENCE TO RELATED APPLICATIONS

This application is a national stage application under 35 U.S.C. 371 of PCT/EP2019/055761, filed Mar. 7, 2019, which claims the benefit of German Application No. 10 2018 107 496.4, filed Mar. 28, 2018, both of which are incorporated herein by reference in their entireties.

TECHNICAL FIELD

The present disclosure relates to an electro-acoustic resonator device. Specifically, the present disclosure relates to a bulk acoustic wave resonator device having top and bottom electrodes and a piezoelectric layer disposed therebetween. The present disclosure also relates to a method of manufacturing a bulk acoustic wave resonator device.

BACKGROUND

Bulk acoustic wave (BAW) resonators are widely used in electronic systems to realize RF filters. A piezoelectric layer is sandwiched between a pair of electrodes. By the application of an electrical signal to the electrodes an acoustic resonating wave is established in the piezoelectric layer. The piezoelectric material may be a deposited material such as aluminum nitride. Recently proposed BAW resonators use a monocrystalline piezoelectric material such as lithium niobate, lithium tantalate or quartz. BAW resonators can be of a solidly mounted resonator (SMR) type where the acoustically active region is mounted on a substrate including a reflector to prevent the acoustic waves from escaping into the substrate or of a film bulk acoustic resonator (FBAR) type where a cavity is disposed underneath the acoustically active region.

A high quality factor of the BAW resonators requires a strong energy confinement. BAW resonators often have specific structures surrounding the acoustically active area to prevent the waves from laterally escaping from the piezoelectric layer.

It is an object of the present disclosure to provide a bulk acoustic wave resonator with an improved lateral energy confinement structure.

It is another object of the present disclosure to provide a method to manufacture a bulk acoustic wave resonator that has an improved lateral energy confinement structure.

SUMMARY

One or more of the above-mentioned objects are achieved by a bulk acoustic wave resonator according to the features of present claim 1.

According to an embodiment, the piezoelectric layer of a bulk acoustic wave (BAW) resonator device is sandwiched between a top electrode layer and a bottom electrode layer. The piezoelectric layer extends laterally beyond the bottom and top electrodes. The thickness of the laterally extended portion of the piezoelectric layer that surrounds the portion of the piezoelectric layer sandwiched between the bottom and top electrodes is different from the thickness of the piezoelectric layers between the top and bottom electrodes. Specifically, the thickness of the piezoelectric layer in the surrounding portion may be larger or thicker than the thickness of the piezoelectric layer in the acoustically active region between the top and bottom electrodes.

According to another embodiment, it is also possible that the thickness of the piezoelectric in the surrounding portion is smaller or thinner than the thickness of the piezoelectric layer in the acoustically active region.

In other terms, according to the first embodiment, the piezoelectric layer in the acoustically active region is recessed with respect to the piezoelectric layer in the surrounding portion. Provided that the surface portions of the piezoelectric layer are flat, the distance or thickness between the top and bottom surfaces of the piezoelectric layer in the acoustically active region is smaller than the distance of the top and bottom surfaces of the piezoelectric layer in the surrounding portion. The portion of the top surface in the acoustically active region provided with the top electrode is recessed compared to the portion of the top surface of the piezoelectric layer surrounding the top electrode.

The use of a monocrystalline piezoelectric material for the BAW resonator device provides lower loss when compared to deposited materials. The herein proposed energy confinement structures surrounding the acoustically active area in connection with the low loss monocrystalline piezoelectric material provide for a high quality factor or Q-factor of the BAW resonator. Monocrystalline piezoelectric materials useful for a BAW resonator device according to this disclosure are lithium niobate ($LiNbO_3$), lithium tantalate ($LiTaO_3$) or quartz. These materials are commercially available as monocrystals from which thin wafers can be sliced. These materials exhibit well defined and reproducible material parameters. Other monocrystalline piezoelectric materials may also be useful.

The monocrystalline piezoelectric material layer in the BAW resonator may have a flat bottom surface on which the bottom electrode is disposed. The top surface of the monocrystalline piezoelectric layer includes the recessed surface area on which the top electrode is disposed. There is a transitional top surface between the portion of larger thickness and the portion of smaller thickness of the piezoelectric layer. The transitional surface may have an oblique orientation with regard to the first and second surface portions of the top surface and with regard to the bottom surface. The top surface includes a step, wherein the step from the thinner portion of the piezoelectric layer in the acoustically active region to the thicker piezoelectric layer portion surrounding the acoustically active region provides a substantial amount of discontinuity for the acoustic resonating wave so that the wave is confined to the active area between the top and bottom electrodes and is prevented from escaping to the surrounding area outside of the top and bottom electrode sandwich. The energy of the acoustic resonating wave is therefore kept in the acoustically active area. The surface of the piezoelectric material proximate the bottom electrode is flat and the surface of the piezoelectric material remote from the bottom electrode comprises a step feature.

The bulk acoustic wave resonator device of the solidly mounted type (BAW-SMR) comprises a mirror arrangement such as a Bragg mirror underneath the bottom electrode to prevent the acoustic wave from escaping into the substrate. The Bragg mirror is disposed on a substrate material that may be a monocrystalline silicon wafer. A Bragg mirror arrangement is well-known to the artisan skilled in this technical field. It comprises a stack of alternate layers having high and low acoustic impedance or being acoustically harder and softer. For example, a layer stack may comprise alternate layers of a dielectric material and a metal. In particular, the acoustically harder layer portions may be made of tungsten separated by a layer of silicon dioxide. The top layer of the Bragg mirror arrangement is composed of silicon dioxide that contacts the bottom electrode of the resonator. During manufacturing of the Bragg mirror arrangement, tungsten is to be formed on silicon dioxide so that a thin adhesion layer of titanium may be disposed on the silicon dioxide to receive the tungsten layer thereon.

A bulk acoustic wave resonator according to the film or free standing bulk acoustic resonator type (BAW-FBAR) comprises a cavity at the bottom electrode so that the bottom electrode is exposed to air. The surrounding bottom surface of the piezoelectric layer is in contact with an insulation layer that may be silicon dioxide. The silicon dioxide layer may be supported by a carrier substrate such as monocrystalline silicon. In the region of the active area of the BAW-FBAR device, the silicon dioxide layer and the silicon carrier substrate layer are removed to obtain a cavity at the bottom electrode. The cavity is surrounded by the remaining silicon dioxide and silicon layers.

The surface of the piezoelectric material proximate the acoustice mirror such as the Bragg mirror arrangement in the SMR case or the cavity in the FBAR case is flat and includes no step. The surface of the piezoelectric material remote from the bottom electrode and remote from the Bragg mirror arrangement and remote from the cavity comprises a step feature. The transitional top surface portion is part of the remote surface.

The manufacturing process according to an embodiment comprises the preparation of a piezoelectric wafer and the preparation of another workpiece and bonding both wafer and workpiece together. Specifically, a wafer is provided of a piezoelectric material. The piezoelectric material may be a monocrystalline piezoelectric material, of which examples are mentioned above. A bottom electrode is formed on the piezoelectric wafer by depositing a metal layer and structuring the metal layer by photolithography steps. A dielectric layer such as a silicon dioxide layer is deposited on that surface of the piezoelectric wafer on which the bottom electrode is disposed. The silicon dioxide deposition may include CVD or a sputter process. Then, ions are implanted through the silicon dioxide layer to reach a predetermined depth within the piezoelectric wafer. The ions may be selected from hydrogen ions, deuterium ions or helium ions or other low molecular weight ions. The depth within the piezoelectric wafer where the ions will be located can be controlled by the acceleration voltage for the ion bombardment and the thickness of the bottom metal electrode. The depth is different underneath the bottom electrode and outside the area of the bottom electrode. The type of metal used for the bottom electrode determines also the penetration depth of the ions.

Furthermore, a carrier substrate workpiece is provided. The carrier substrate may be a monocrystalline silicon wafer. The preprocessed piezoelectric wafer is flipped and bonded to the carrier substrate wafer in that the silicon dioxide surface of the piezoelectric wafer is bonded to the workpiece wafer. The surface layer of the workpiece comprises silicon to be bonded to the silicon dioxide layer of the piezoelectric wafer. The surface layer of the workpiece may be the silicon wafer as such or a silicon dioxide layer deposited on the workpiece. Then, the piezoelectric wafer is split at the region where the implanted ions are located. The implanted ions insert damage in the original monocrystalline structure of the piezoelectric wafer so that the piezoelectric material can be separated along the line of the implanted ions. Splitting may be performed by mechanical impact and/or thermal energy that causes thermal stress within the piezoelectric material. After removal of the split piezoelectric portion the top electrode is formed by deposition and structuring of a metal electrode material in the cavity established after removal of the split portion.

The electrode may be made of molybdenum that has relatively high acoustical hardness and relatively high electrical conductivity. A thin seed layer of aluminum nitride may be deposited on the piezoelectric wafer to facilitate good growth of the molybdenum grains. As an alternative, a sandwich of a layer of tungsten and a layer of aluminum may be used, wherein tungsten which has superior acoustical hardness is deposited on the piezoelectric layer and aluminum which has high electrical conductivity is deposited thereon. Other metals for the electrode are also useful, such as ruthenium, iridium and platinum, either as a single layer or as a sandwich of several layers of one or more of these metals.

The ions penetrate the piezoelectric material to a relatively large depth in the area outside, surrounding the metal electrode material and penetrate the piezoelectric material at a lower depth in the area where they pass the metal electrode material. After flipping, bonding and splitting the piezoelectric wafer, the lower penetration depth of the ions in the area of the metal electrode when compared to the surrounding area leads to a recessed portion of the piezoelectric material and smaller thickness above the bottom electrode when compared by the surrounding portion. Correspondingly, the thickness of the piezoelectric material after splitting is higher in the surrounding region where the penetration depth of the ions is larger. Using an ion-cut process in connection with the bonding of the piezoelectric wafer with a carrier wafer, a different thickness of piezoelectric material in the active area and outside thereof can be achieved. The transitional area between the piezoelectric material of smaller and larger thickness has the function of a confinement feature that confines the acoustical energy within the active area of the BAW resonator.

The silicon dioxide layer is deposited on the structured bottom metal electrode and the surface of the piezoelectric wafer. The surface of the silicon dioxide on top of the metal electrode may protrude to a certain extent over the rest of the silicon dioxide surface. In order to prepare the piezoelectric wafer for bonding, the surface of the silicon dioxide is planarized to obtain a uniform planarized silicon dioxide surface. Planarization may be performed by a chemical mechanical polishing (CMP).

According to this embodiment, a mask is formed on the piezoelectric wafer before the bottom electrode is formed. The ions penetrate the piezoelectric material to a first depth underneath the mask layer and to a second larger depth in the area not covered by the mask. The mask is removed after the implantation step and the bottom electrode is formed thereafter in the area that was not covered by that mask. As a result, the thickness of the piezoelectric material achieved after splitting is larger in the active area of the device and smaller in the surrounding area. The remainder of process steps concerning the bonding of piezoelectric wafer and workpiece are the same as for the first mentioned method.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments.

DETAILED DESCRIPTION OF EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure. The same elements in different figures of the drawings are denoted by the same reference signs.

Turning now to FIGS. 1A through 1E, several consecutive process steps concerning the preparation of a monocrystalline piezoelectric wafer 110 are shown. These processing steps are the same for the fabrication of a BAW device according to the SMR and the FBAR type. The piezoelectric wafer is denoted by "A". The wafer 110 is made of a monocrystalline piezoelectric material such as $LiNbO_3$, $LiTaO_3$ or quartz.

In case of a $LiNbO_3$ piezoelectric wafer the piezoelectric material may be cut along a preference direction to achieve the desired piezoelectric properties. It is possible that the the monocrystalline piezoelectric material of the piezoelectric wafer has a cut angle selected from (0°, 90°, 0°), (0°, 300°, 0°), and (0°, 120°, 0°). In this case, the Euler angles ($\lambda$, $\mu$, $\theta$) are defined as follows: a set of axes x, y, z, which are the crystallographic axes of the substrate, are firstly taken as a basis. The first angle, $\lambda$, specifies the amount by which the x-axis and the y-axis are rotated about the z-axis, the x-axis being rotated in the direction of the y-axis. A new set of axes x', y', z' accordingly arises, where z=z'. In a further rotation, the z'-axis and the y'-axis are rotated about the x'-axis by the angle $\mu$. In this case, the y'-axis is rotated in the direction of the z'-axis. A new set of axes x", y", z" accordingly arises, where x'=x". In a third rotation, the x"-axis and the y"-axis are rotated about the z"-axis by the angle $\theta$. In this case, the x"-axis is rotated in the direction of the y"-axis. A third set of axes x''', y''', z''' thus arises, where z"=z'''. In this case, the x'''-axis and the y'''-axis are parallel to the surface of the substrate. The z'''-axis is the normal to the surface of the substrate. The x'''-axis specifies the propagation direction of the acoustic waves. The definition is in accordance with the international standard IEC 62276, 2005-05, Annex A1. The given angles $\lambda$, $\mu$, and $\theta$ can have tolerances of ±5° or ±10°: (0°±5°, 90°±5°, 0°±5°), (0°±10°, 90°±10°, 0°±10°), (0°±10°, 300°±10°, 0°±10°), and (0°±10°, 120°±10°, 0°±10°).

Figure 1A:
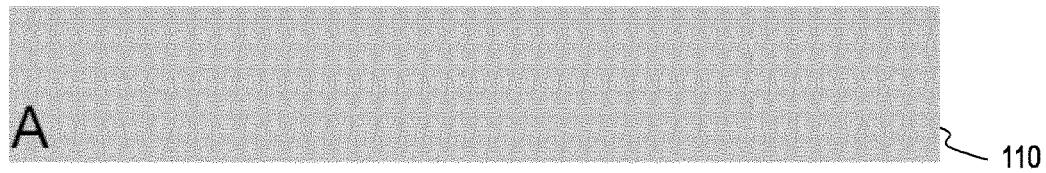
FIGS. 1A through 1E show consecutive process steps of the treatment of a monocrystalline piezoelectric wafer.
Figure 1B:
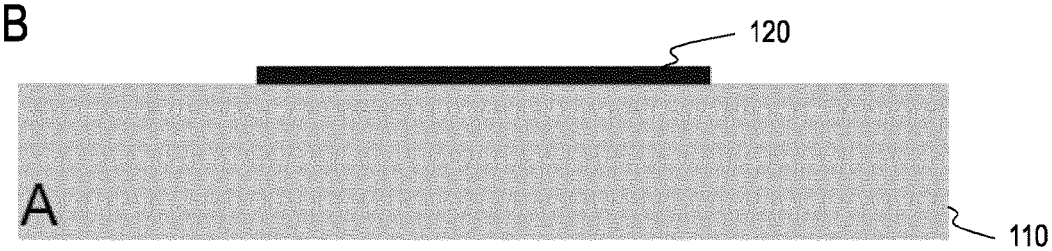

According to FIG. 1B, a metal electrode 120 is formed on the surface of the piezoelectric material 110. That surface is flat where the electrode is formed and in the vicinity of the electrode. A metal layer of preferably molybdenum is deposited on the surface of wafer 110. The metal electrode is structured by forming a photoresist mask and removing the excess metal by etching. A seed layer of aluminum nitride may be disposed between wafer 110 and electrode layer 120. Electrodes of alternative metals may also be possible such as a sandwich layer of tungsten and aluminum or a layer of ruthenium, iridium or platinum or a sandwich layer of one or more of the above-mentioned metals.

Figure 1C:
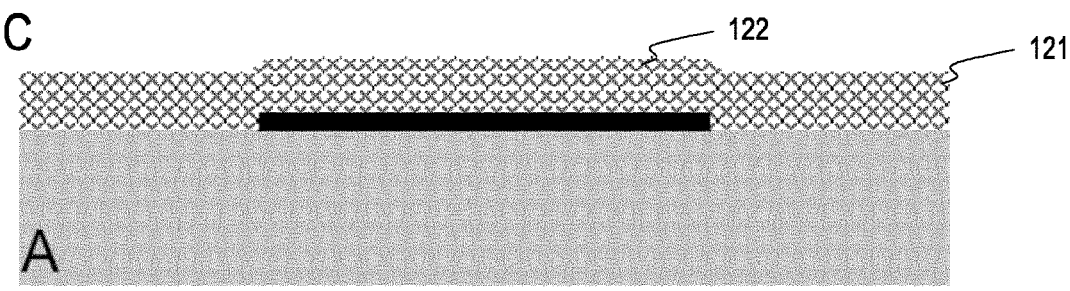

Turning now to FIG. 1C, a layer 121 of an insulating material is deposited such as silicon dioxide. Silicon dioxide may be deposited by chemical vapor deposition (CVD) or a physical process such as sputtering. In the area above the metal electrode, the surface of the silicon dioxide protrudes slightly because the deposition process is conformable. Another seed layer may be deposited on the metal electrode to facilitate the forming of the insulating layer thereon. This seed layer may be aluminum nitride.

Figure 1D:
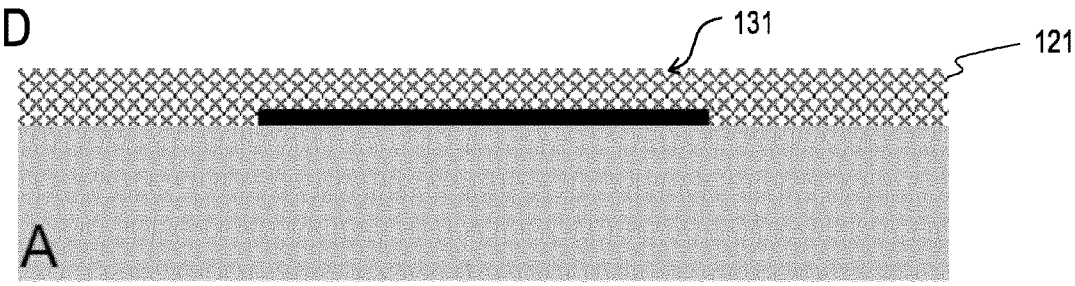

Turning now to FIG. 1D, the surface of the silicon dioxide layer is planarized to achieve a uniform, flat surface 130 of the silicon dioxide layer. Planarization may be made by a chemical mechanical polishing (CMP) process.

Figure 1E:
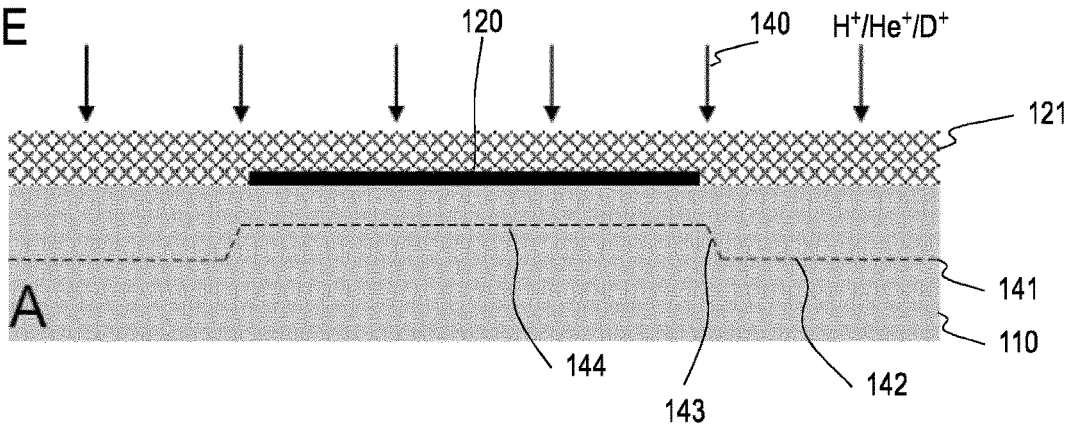

Turning now to FIG. 1E, ions are implanted into the processed wafer as shown with arrows 140. Suitable ions for the implantation may be hydrogen ions (H+), helium ions (He+) or deuterium ions (D+). Other ions of low molecular range may be also be possible. The ions penetrate the silicon dioxide 121 and reach a certain depth as shown at dashed line 141 within the monocrystalline piezoelectric layer 110. The penetration depth of the ions comprises substantially three portions 142, 143, 144. In the area covered by the metal bottom electrode 120, the ions penetrate at reduced depth 144 into the piezoelectric wafer as the metal electrode 120 absorbs a certain amount of kinetic energy from the ions. In the area surrounding the metal electrode 120, the penetration depth 142 is larger than in the area covered by the electrode. Between penetration portions 142, 144 is the transitional portion 143 where the penetration depth is between the levels 142 and 144 and increases from level 144 to level 142.

The depth of penetration can be determined by the acceleration voltage of the ions and the thickness of the metal electrode. The type of metal material for the bottom electrode 120 determines also the penetration depth so that the depth is different for electrodes of different metal material. The presence of implanted ions at the levels 142, 143, 144 damages the crystalline structure of the piezoelectric wafer to a certain extent so that a weakness is inserted in the piezoelectric material. Although the penetration depth level 141 is depicted with a dotted line, the depth is not exact but it can be relatively well-controlled having a defined maximum concentration as depicted by dotted line 141.

Figure 2:
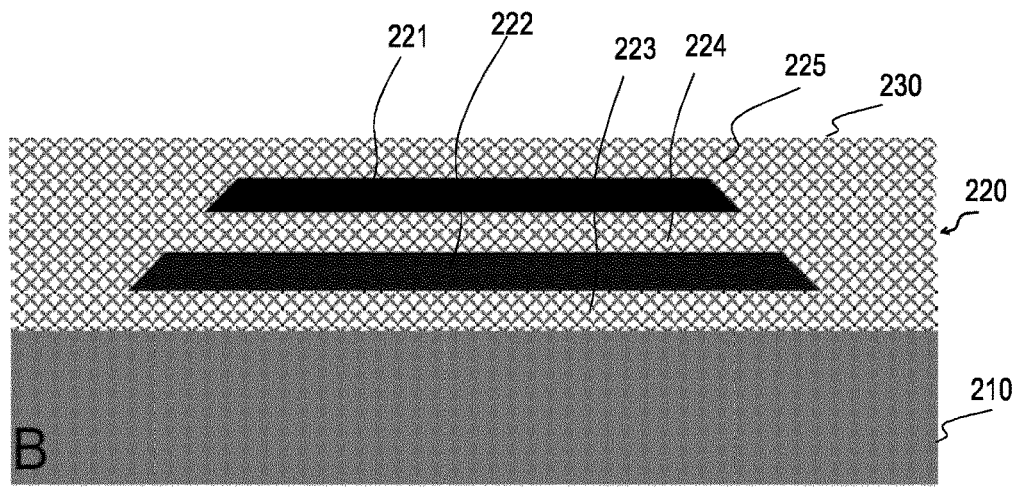
FIG. 2 shows a carrier wafer with a Bragg mirror.

Turning now to FIG. 2, a carrier wafer 210 depicted with "B" is provided. Carrier wafer 210 may be a substrate suitable for carrying a Bragg mirror arrangement 220. Wafer 210 may be a monocrystalline silicon wafer. Bragg mirror 220 comprises an alternate sequence or stack of layers having acoustically softer and acoustically harder characteristics. For example, Bragg mirror 220 comprises a lowermost silicon dioxide layer 223, thereon disposed a metal layer such as a tungsten layer 222, thereon disposed another silicon dioxide 224 and thereon disposed another tungsten layer 221. The top surface of the Bragg mirror 220 is formed of silicon dioxide layer 225 which has a planarized surface 230. The silicon dioxide layers have low acoustic impedance or are acoustically soft. The tungsten layers have high acoustic impedance or are acoustically hard. A suitable distance between the layers or layer thickness is related to the wavelength of the resonance frequency of the resonating acoustical wave and ensures that the acoustic wave entering through the silicon dioxide surface 230 is reflected and does not propagate deep into the material. Between a silicon dioxide layer and a tungsten layer, a thin layer of titanium may be provided as an adhesion layer to facilitate the deposition of tungsten. Alternative materials for the layers of high acoustic impedance are also useful such as other metals or aluminum nitride.

Figure 3A:
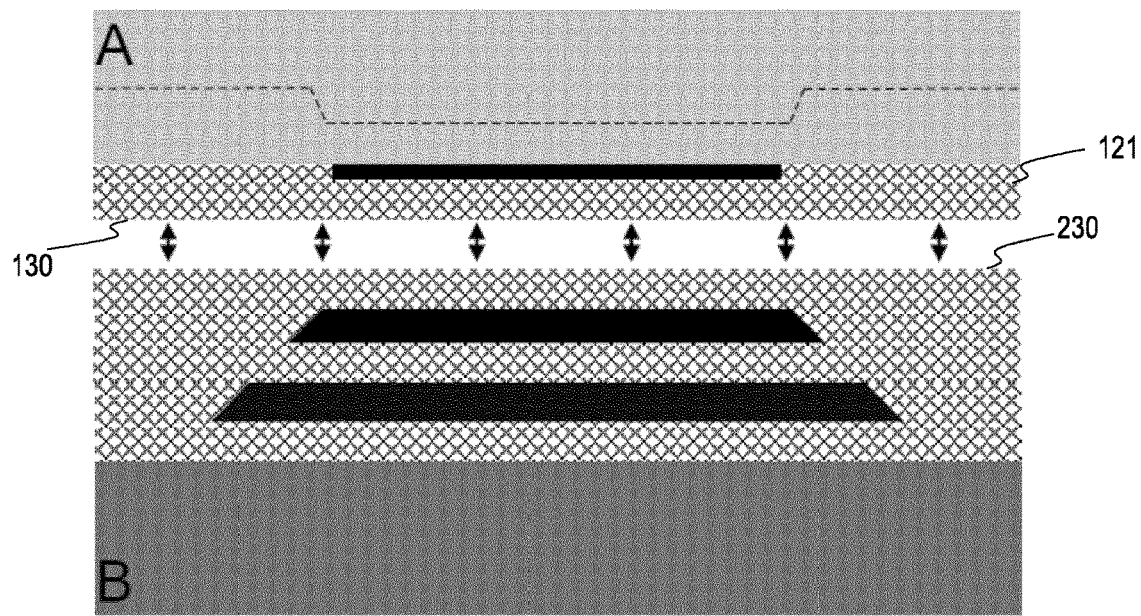
FIGS. 3A through 3C show consecutive process steps to manufacture a BAW-SMR device.
Figure 3B:
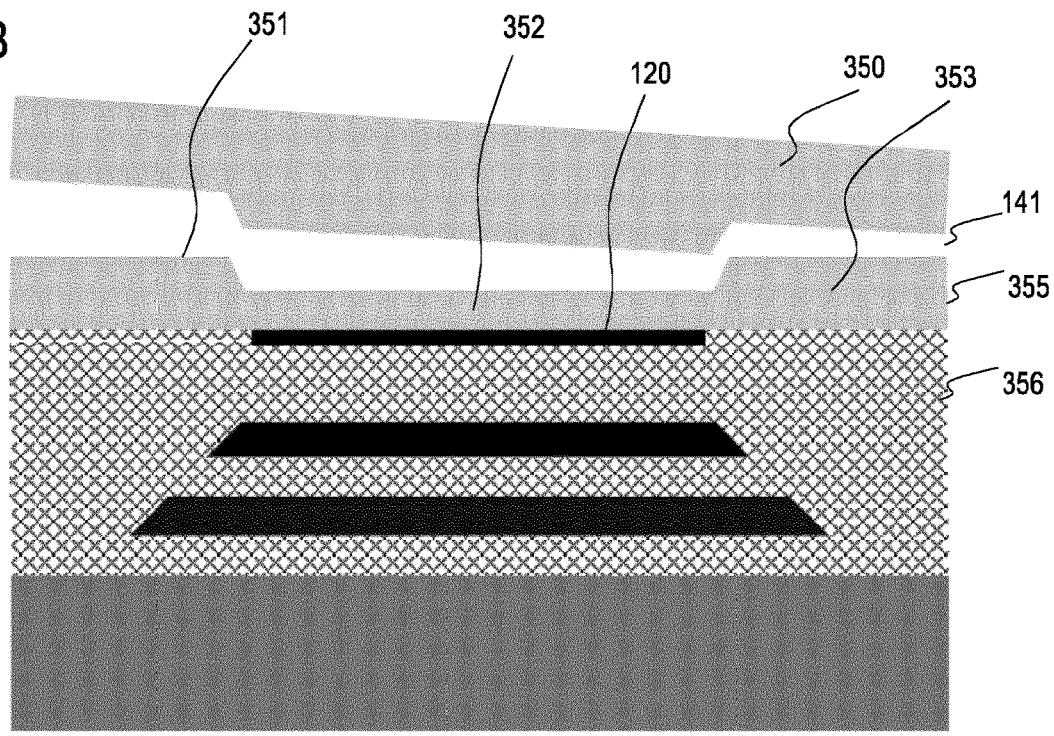
Figure 3C:
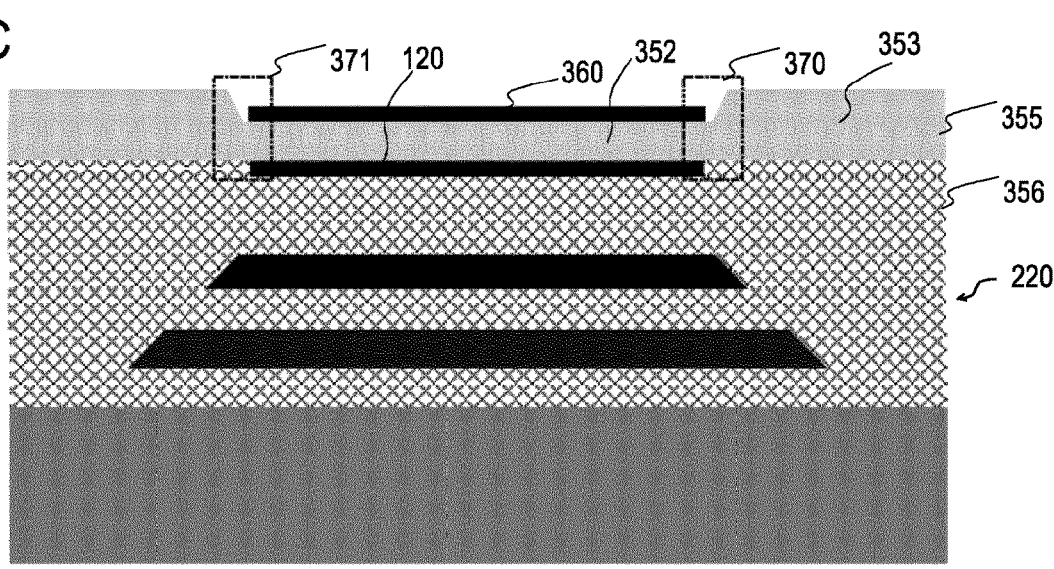

FIGS. 3A through 3C show consecutive process steps in connection with and after the bonding of prefabricated wafers A and B. As shown in FIG. 3A, wafer A is flipped so that the planarized surface 130 of the topmost silicon dioxide layer 121 is opposite the planarized surface 230 of the silicon dioxide layer of the Bragg mirror. Both surfaces 130, 230 are brought in contact with each other and thereby bond together. Bonding of two silicon dioxide surfaces is a known and understood process. The silicon dioxide surfaces may be cleaned before bonding. The bonding may be performed with a defined amount of pressure, preferably at elevated temperature such as in the range from 150° C. to 300° C.

Turning now to FIG. 3B, portion 350 of the monocrystalline piezoelectric wafer that is distant from the other layers of the device is removed. The splitting of portion 350 from the portion 355 is achieved by a mechanical impact. For example, a mechanical impact can be caused by the insertion of a blade to mechanically delaminate layer 350 from layer 355. As an alternative or additionally, the wafer can be heated to generate thermal stress to enhance delamination. The delamination of portions 350 from 355 occurs along level 144 of the implanted ions. This process is also called ion-cut. As the penetration depth of the ions is different over the wafer, the thickness of the monocrystalline piezoelectric layer 355 bonded to the device is smaller or thinner in the area 352 of the bottom electrode 120 and is larger or thicker in the area 353 surrounding the bottom electrode 120. As can be gathered from FIG. 3B, the thickness of the monocrystalline piezoelectric layer in the active area above bottom electrode 120 is smaller than the thickness outside the active area. The portion 355 of the piezoelectric layer remaining at the device remains connected to the silicon dioxide material 356 and carries the bottom electrode 120 at its bottom surface.

Turning now to FIG. 3C, a metal top electrode 360 is formed on the surface of the active area 352 that is in the area 352 where the monocrystalline piezoelectric material is recessed having reduced thickness. The top metal electrode 360 may include the same metal or metals as the bottom electrode 120. The electrode is deposited on the surface of the piezoelectric layer and is structured to the desired shape and size. The bottom surface of the piezoelectric layer is flat and is in contact with the silicon dioxide layer 356 and the bottom electrode 120. As is shown by the dashed rectangles 370, 371, there is a transitional portion of the monocrystalline piezoelectric layer 355 between the thin active area and the thicker surrounding area. The transitional portions 370, 371 forming the step feature are disposed on that surface of the piezoelectric layer 355 that is remote from the Bragg mirror arrangement 270. The increase in depth in the transitional area 370 has the function of a lateral energy confinement feature for the acoustic resonating wave that is established during the operation of the device between the top and bottom electrodes 360, 120. Such a discontinuity in the form of a rapid increase in thickness in the piezoelectric layer in the vicinity of the edge of the electrodes prevents the escape of the acoustic wave from the active area. The lateral energy confinement structures are defined by a single process step such as the implanting of ions with different depth across the piezoelectric wafer. The surface of the piezoelectric layer 355 in contact with the Bragg mirror is flat, whereas the opposite surface of the piezoelectric layer remote from the Bragg mirror includes the energy confinement step feature. With the use of a monocrystalline piezoelectric material high piezoelectric coupling is achieved together with low losses in the material. The strong confinement of the acoustic wave in the active area ensures that the acoustic energy remains in the active area. As a consequence, the BAW resonator device has a high quality factor and low losses. These advantages are achieved with the use of a monocrystalline piezoelectric material in combination with the above-described ion-cut technology.

It is to be noted that other lateral confinement structures such as notches and protrusions at the edge of the active area are often used for BAW resonators. Such other lateral energy confinement features may also be implemented in a BAW resonator according of the present embodiment (not shown) by means of, e.g. mass layers having defined size, shape, thickness, mass and overlap/underlap areas to provide enhanced matching between the resonator area and outside thereof. These mass layers may be made of a metal, an oxide such as silicon oxide or a nitride. They require structuring including etching at the active area and the top electrode. However, such additional lateral energy confinement features become obsolete or may have smaller size and complexity than in conventional devices, because the present device already exhibits an efficient lateral energy confinement structure in the form of the step of increasing thickness of the piezoelectric layer, as shown at 370, 371. In this case, the additional critical steps for forming and structuring the additional energy confinement structures are few and less complex so that the surfaces of the resonator area and the top electrode are less or almost not impacted.

Figure 4:
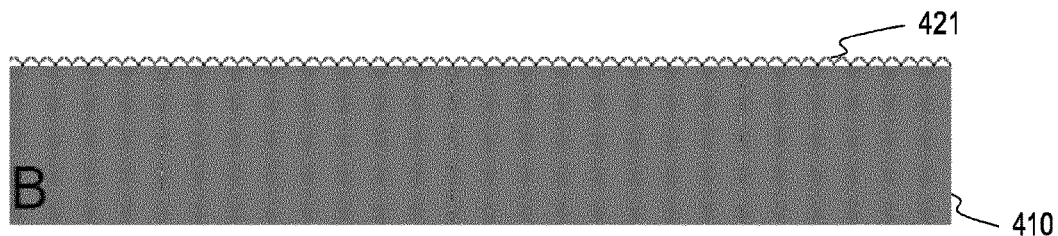
FIG. 4 shows another carrier wafer.

FIGS. 4 and 5 show an embodiment for a BAW-FBAR device. Turning now to FIG. 4, a carrier substrate wafer 410 labelled with "B" is shown that has a thin silicon dioxide layer 421 at its surface. Silicon dioxide 421 is generated by CVD or sputtering to achieve a defined thickness and surface quality.

Figure 5A:
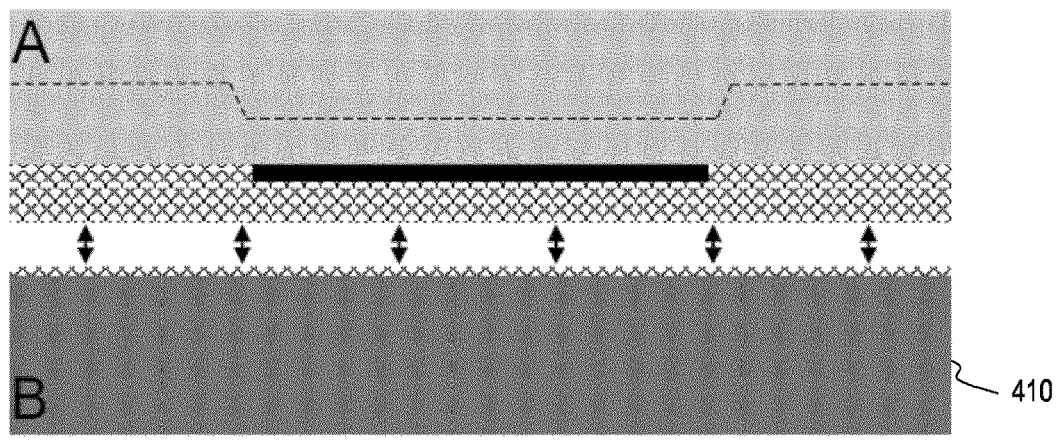
FIGS. 5A through 5D show consecutive process steps to manufacture of a BAW-FBAR device.

Turning now to FIG. 5A, substrate wafer 410 is bonded to the flipped ion implanted monocrystalline piezoelectric wafer "A" fabricated along the process described in connection with FIGS. 1A through 1E.

Figure 5B:
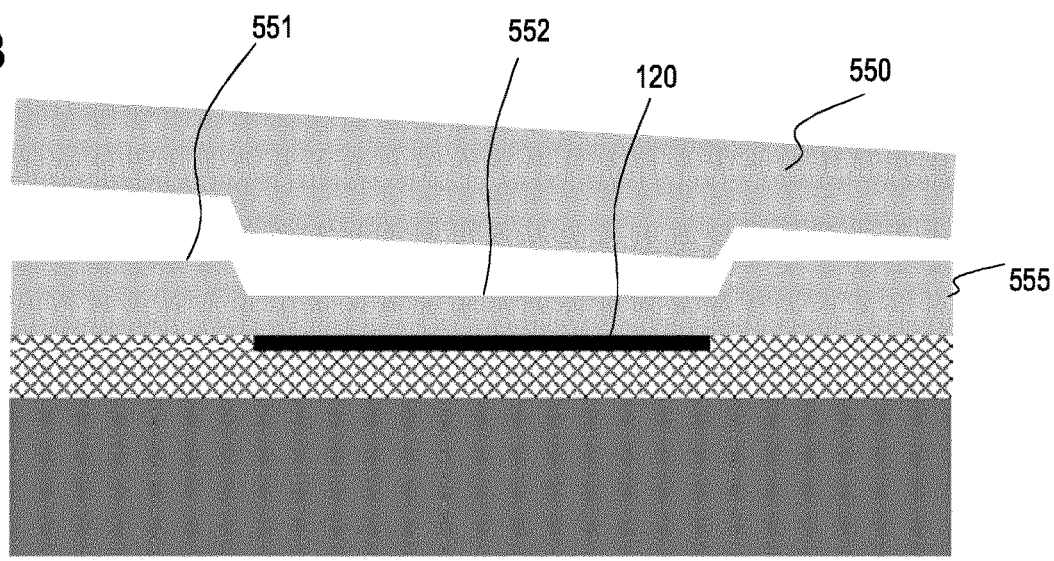

Turning now to FIG. 5B, the topmost portion 550 of the ion implanted piezoelectric wafer is removed and split from the remaining bonded piezoelectric wafer portion 555 according to the above-described ion-cut process. The piezoelectric layer portion 555 exhibits a thin, recessed piezoelectric portion 552 at the bottom electrode 120 and a protruding, thicker portion 551 surrounding the recessed portion 552 and the bottom electrode portion 120.

Figure 5C:
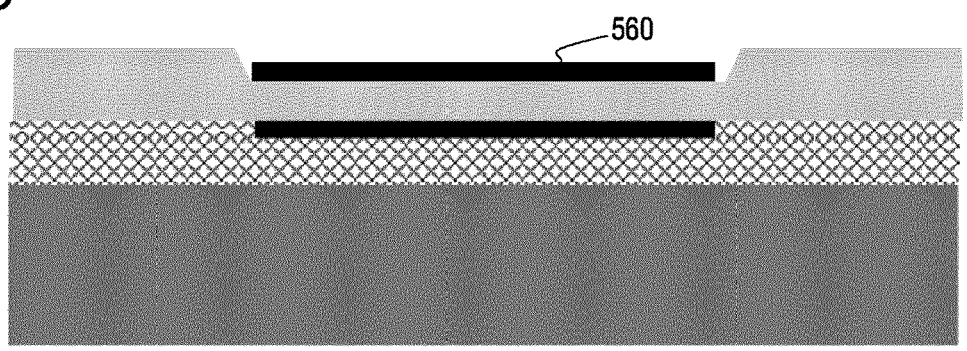

Turning now to FIG. 5C, the top electrode 560 is formed by deposition and structuring so that the top electrode 560 is positioned within the recessed area of the piezoelectric layer.

Figure 5D:
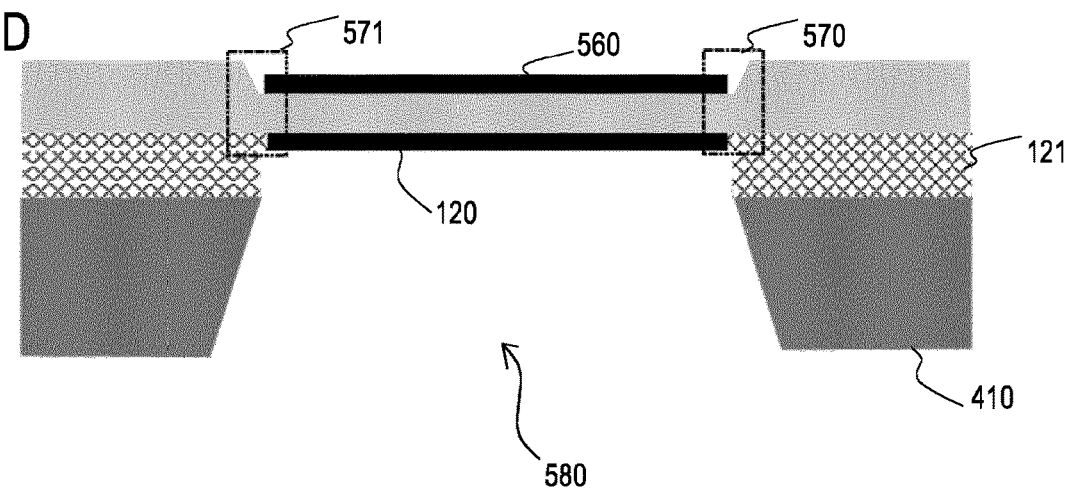

Turning now to FIG. 5D, a cavity 580 is formed underneath the active area and underneath the bottom electrode 120. The cavity can be formed by several etching steps performed from the bottom side of the device. The etching steps remove the monocrystalline silicon wafer 410 and the dielectric layer 121 in the region of the acoustically active area to reach the surface of the bottom electrode 120. The bottom electrode 120 is exposed to air so that no additional mirror elements are necessary. The silicon wafer 410 may be etched in a reactive ion etching process involving sulphur hexafluorine ($SF_6$). The silicon dioxide layer 121 may be etched in a hydrogen fluoride (HF) vapor etching process. The etch process stops at the surface of the metal bottom electrode 120. If a seed layer of, e.g. aluminum nitride, is provided on the bottom electrode, the etch process stops at this seed layer rather than direct on the metal electrode.

The resulting BAW-FBAR device includes the lateral energy confinement structures 570, 571 that exhibit a step in the thickness of the monocrystalline piezoelectric layer. Optionally and additionally, additional matching features (not shown) can be formed in the areas 570, 571, as already described in connection with FIG. 3C.

In another embodiment (not shown in the drawings), the penetration depth of the ions into the piezoelectric substrate material can be less in the region surrounding the active area than in the region of the active area. To achieve this effect a mask layer is formed on the piezoelectric wafer covering the region surrounding the region intended for the active area so that this mask absorbs kinetic energy from the implanted ions so that the penetration depth is smaller than in the region intended for the active area that was not covered by the mask. The mask material may be a material that retards the ions. In one embodiment the mask may be a metal. The metal may be the same metal as the material for the electrode to be formed after the mask step. For example, the mask material may be Molybdenum.

Then, the mask is removed and the bottom electrode is formed in the area that was not covered by the mask. Thereafter the wafer is provided with an insulating layer such as silicon dioxide to prepare it for bonding. The process proceeds in the same way as explained in connection with FIGS. 2 to 5D. After splitting the piezoelectric wafer material, the piezoelectric material in the region surrounding the electrode or surrounding the active area is thinner than in the active area region.

In conclusion, improved BAW resonators with a high quality factor employ low loss monocrystalline piezoelectric materials that have low intrinsic losses. The transfer of thin layers of the monocrystalline piezoelectric material onto wafers forming a BAW resonator is achieved by an ion-cut technique using ion implantation. This process allows to define lateral energy confinement structures within the same single process step taking advantage of the different penetration depths of the ions into the monocrystalline piezoelectric material in the area structured with a metal electrode and in the surrounding area. The ion-cut technique employs H+/D+/He+ ions implanted into the monocrystalline piezoelectric wafer prestructured with a metal electrode and embedded in silicon dioxide. The metal electrode serves as a mask leading to lower penetration depth of the ions into the piezoelectric material when compared to areas outside the metal electrode covered with silicon dioxide only. After the splitting of the piezoelectric wafer, the piezoelectric layer is thicker outside the resonator area compared to the areas covered with the metal electrode which is the resonator area. The different piezoelectric film thicknesses in the resonator area and outside serve as a lateral barrier resulting in a lateral energy confinement of the acoustic energy within the resonator. The film thickness difference between the resonator area and outside can be adjusted by the thickness of the electrode, the electrode material and the acceleration voltage of the ions implanted in the piezoelectric material. Additional lateral energy confinement features can be optionally added by means of overlap/underlap areas to provide optimal matching between the resonator area and outside. These additional confinement features, however, need to be less complex than in conventional devices.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirt and substance of the disclosure may occur to the persons skilled in the art, the disclosure should be construed to include everything within the scope of the appended claims.

The invention claimed is:

1. A bulk acoustic wave resonator device, comprising: a bottom electrode and a top electrode; and a piezoelectric layer having a first portion disposed between the bottom electrode and the top electrode, the first portion having a thickness, the piezoelectric layer having a second portion on at least two sides of the first portion, the second portion having a thickness different from the thickness of the first portion, wherein the piezoelectric layer has a first surface facing the bottom electrode and a second surface opposite the first surface, the second surface including: a first surface portion facing the top electrode; a second surface portion associated with at least a portion of the second portion of the piezoelectric layer; and a transitional surface portion disposed between the first and second surface portions of the second surface, wherein the transitional surface portion has an oblique orientation with regard to the first surface portion and the second surface portion of the second surface.

2. The bulk acoustic wave resonator device according to claim 1, wherein the thickness of the second portion of the piezoelectric layer is larger than the thickness of the first portion of the piezoelectric layer.

3. The bulk acoustic wave resonator device according to claim 1, wherein the first portion of the piezoelectric layer is recessed with respect to the second portion.

4. The bulk acoustic wave resonator device according to claim 1, wherein the piezoelectric layer comprises a monocrystalline piezoelectric material.

5. The bulk acoustic wave resonator device according to claim 1, further comprising a Bragg mirror arrangement disposed on a carrier substrate, wherein the Bragg mirror arrangement is disposed opposite the bottom electrode from the piezoelectric layer.

6. The bulk acoustic wave resonator device according to claim 5, wherein the Bragg mirror arrangement comprises a stack of alternate layers of materials having high and low acoustic impedance, respectively.

7. The bulk acoustic wave resonator device according to claim 1, wherein the piezoelectric layer has a first surface facing the bottom electrode and a second surface opposite the first surface and wherein a layer of an insulating material is disposed over the first surface of the piezoelectric layer surrounding a cavity at the bottom electrode, wherein the bottom electrode faces the cavity.

* * * * *